United States Patent
Iyer et al.

(10) Patent No.: US 12,519,475 B2
(45) Date of Patent: Jan. 6, 2026

(54) DFE-BASED PEAKING TECHNIQUES FOR HIGH-SPEED TRANSMITTERS

(71) Applicant: Avago Technologies International Sales Pte. Limited, Singapore (SG)

(72) Inventors: Arvindh Iyer, Foothill Ranch, CA (US); Anand J. Vasani, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 43 days.

(21) Appl. No.: 18/395,286

(22) Filed: Dec. 22, 2023

(65) Prior Publication Data

US 2025/0211237 A1    Jun. 26, 2025

(51) Int. Cl.
*H03K 19/00*   (2006.01)
*H03K 17/687*  (2006.01)
*H03K 19/20*   (2006.01)

(52) U.S. Cl.
CPC ......... *H03K 19/20* (2013.01); *H03K 17/6872* (2013.01)

(58) Field of Classification Search
CPC .......... H04B 1/0475; H04B 2001/0425; H03F 27/367; H03B 1/32; H03B 1/3247; H03B 1/3241
See application file for complete search history.

(56) References Cited

U.S. PATENT DOCUMENTS

| | | | |
|---|---|---|---|
| 7,292,061 B2 | 11/2007 | Oh | |
| 7,982,500 B2 | 7/2011 | Luich | |
| 10,348,290 B1 * | 7/2019 | Zhang | H03K 19/17744 |
| 10,505,509 B2 * | 12/2019 | Lakshmikumar | H03F 1/30 |
| 10,951,250 B1 * | 3/2021 | Abdelhalim | H01S 5/0427 |
| 11,398,934 B1 * | 7/2022 | Casey | H04L 25/0272 |

(Continued)

OTHER PUBLICATIONS

Fu, Q. et al., A 57.2-Gb/s PAM4 Driver for a Segmented Silicon-Photonics Mach-Zehnder Modulator with Extinction Ratio >9-dB in 45-nm RF-SOI CMOS Technology, 2021 IEEE International Symposium on Circuits and Systems (ISCAS), IEEE, 2021, pp. 1-5.

(Continued)

*Primary Examiner* — Tuan T Lam
(74) *Attorney, Agent, or Firm* — Quarles & Brady LLP

(57) ABSTRACT

A circuit for driving digital-to-analog converter (DAC) comprising a serializer configured to combine multiple signals to one input signal to drive a forward inverter coupled to a first node with a first impedance in serial configuration and a first capacitance in shunt configuration. The circuit includes a chain of inverters coupled in series to transfer the input signal from the first node to the fifth node based on a signal transfer function. The circuit further includes a feedback inverter between the third node and the first node to form a feedback loop with two inverters in the chain, adding peaking in the signal transfer function at the first node. A second feedback inverter can be added between the fifth node and the third node to add peaking in the signal transfer function at the third node. The feedback inverter is designed as a current-starved inverter in order to alleviate hot-carrier injection (HCI) aging of the transistors and add programmability in the peaking. The circuit includes a DAC switch coupled to the fifth node.

15 Claims, 11 Drawing Sheets

(56) References Cited

U.S. PATENT DOCUMENTS

| | | |
|---|---|---|
| 11,711,081 B2 | 7/2023 | Francis |
| 12,237,878 B2* | 2/2025 | Poulton .................... H04B 3/04 |
| 2002/0057101 A1* | 5/2002 | Tang ................... H04L 25/0286 |
| | | 326/29 |
| 2018/0234096 A1* | 8/2018 | Li ........................ H03K 17/941 |
| 2024/0039483 A1* | 2/2024 | Ismail .................... H03F 1/483 |
| 2024/0429905 A1* | 12/2024 | Hollis .............. H03K 19/01855 |

OTHER PUBLICATIONS

European Patent Office, Extended Search Report, Application No. 24218941.3, May 15, 2025, 7 pages.

* cited by examiner (Existing Art)

(Existing Art)

(Existing Art)

(Existing Art)

(Existing Art)

(Existing Art)

DFE-BASED PEAKING TECHNIQUES FOR HIGH-SPEED TRANSMITTERS

FIELD OF INVENTION

The subject technology is related to devices supporting high-speed data transmission.

BACKGROUND OF THE INVENTION

In the realm of high-speed data transmission circuitry, the tail-less CML DAC driver emerges as an evolution of the traditional current-mode logic (CML) topology tailored for driving Digital-to-Analog Converters (DACs) at high speeds. This design finds its niche particularly in high-performance applications like wireline communications, data centers, and advanced RF communication systems. In applications where data rates reach several Gbps or even tens or hundreds of Gbps, maintaining signal integrity is paramount. Tail-less CML DAC driver in high-speed transmitter is typically constructed in an architecture consisting of an array of DAC slices, each of which consists of an input source switch and a current source, a serializer configured to minimize the clock loading and power, and a full-rate pre-driver to bridge the fan-out between the serializer and the switch. The pre-driver is usually implemented using a CMOS inverter chain composed of complementary pairs of metal-oxide-semiconductor field-effect transistors between the serializer and the switch. Signal bandwidth is usually a bottleneck for full-rate operation of the high-speed transmitters. Improved technique for extending bandwidth of the CMOS inverter chain is desired.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1A:
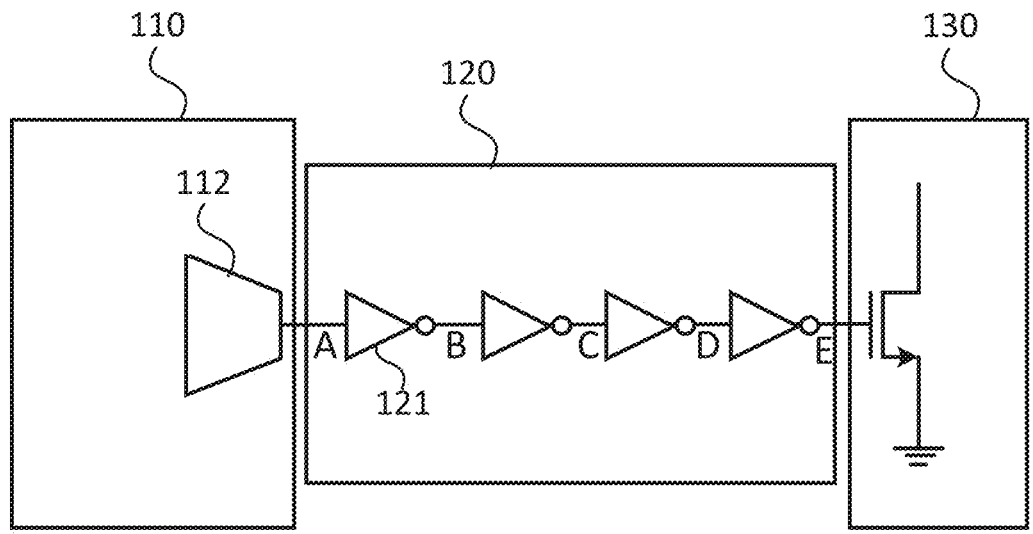
FIG. 1A is a schematic diagram of a pre-driver data path based on a CMOS inverter-chain.

The subject technology is related to devices supporting high-speed data transmission. In an embodiment, a pre-driver circuit for driving a digital-to-analog converter used in high-speed transmitters is provided. The circuit includes a serializer configured to combine multiple signals into one input signal. The circuit includes a chain of inverters coupled in series from the first node to a last node and configured to transfer the input signal to the last node based on a signal transfer function. The circuit further includes a feedback inverter configured to add peaking in the frequency response of the signal transfer function at the first node and the third node. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the subject technology is not intended to be limited to the embodiments presented, but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification, and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

When an element is referred to herein as being "connected" or "coupled" to another element (including but not limited to electrical and communicative connections and coupling), it is to be understood that the elements can be directly connected to the other element or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "circuit," it is to be understood that, among other things, (a) a circuit may be a path or network through which electric current can flow, formed by interconnecting different electrical components. This network of components, which can include elements like resistors, capacitors, inductors, transistors, diodes, and wires, is designed to perform a specific function, such as amplifying a signal, converting energy forms, processing information, or controlling a system; (b) in a general aspect in advance semiconductor and communication technology fields, a circuit may comprise a single device (e.g., a single integrated circuit) or multiple devices (e.g., multiple chips on a single printed circuit board); and (c) a circuit may include hardware working in conjunction with software or firmware.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

For many high-speed signal transmission applications, a tail-less CML DAC driver (referred as DAC driver in subsequent specification) is used in high-speed transmitters. A typical architecture of the DAC driver may include an array of DAC slices, each of which consists of an input source switch and a current source, a serializer, for example, a 4:1 serializer configured to minimize the clock loading and power, and a full-rate pre-driver to bridge the fan-out between the serializer and the switch in the DAC driver. The switch can be configured to have its size and bias current decided by the target output (analog) signal swing. The serializer is typically sized to minimize the clocking power. The pre-driver is implemented using a CMOS inverter-chain between the serializer and the switch. FIG. 1A is a schematic diagram of a pre-driver data path based on a CMOS inverter-chain. As shown, the serializer 110 may include a multiplexer 112 at its output, i.e., converting multiple signals to a serialized input signal (each signal being a symbol containing one or more bits). The pre-driver 120 receives this input signal from a first node A and through a data path made by an inverter chain comprising a sequence of inverters coupled in series from the first node A, to second node B, . . . and to a last node E. The first node A has the highest fan-out as it is directly coupled to the output of the multiplexer 112. The switch 130 is coupled to the last node E to receive the output signal from the pre-driver data path.

Figure 1B:
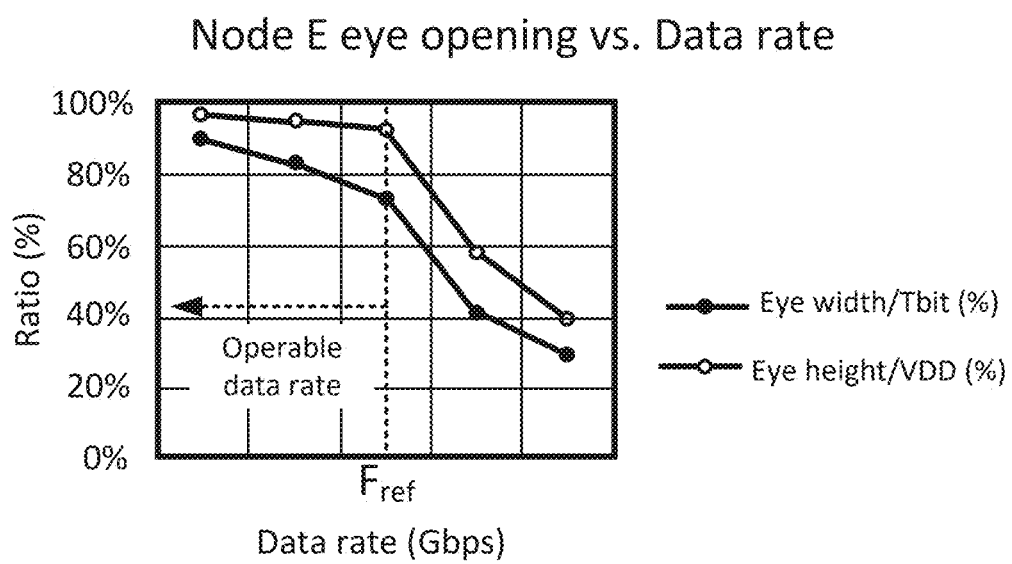
FIG. 1B is a plot of eye opening versus data rate for node E in the pre-driver based on a CMOS inverter-chain of FIG. 1A.
Figure 1C:
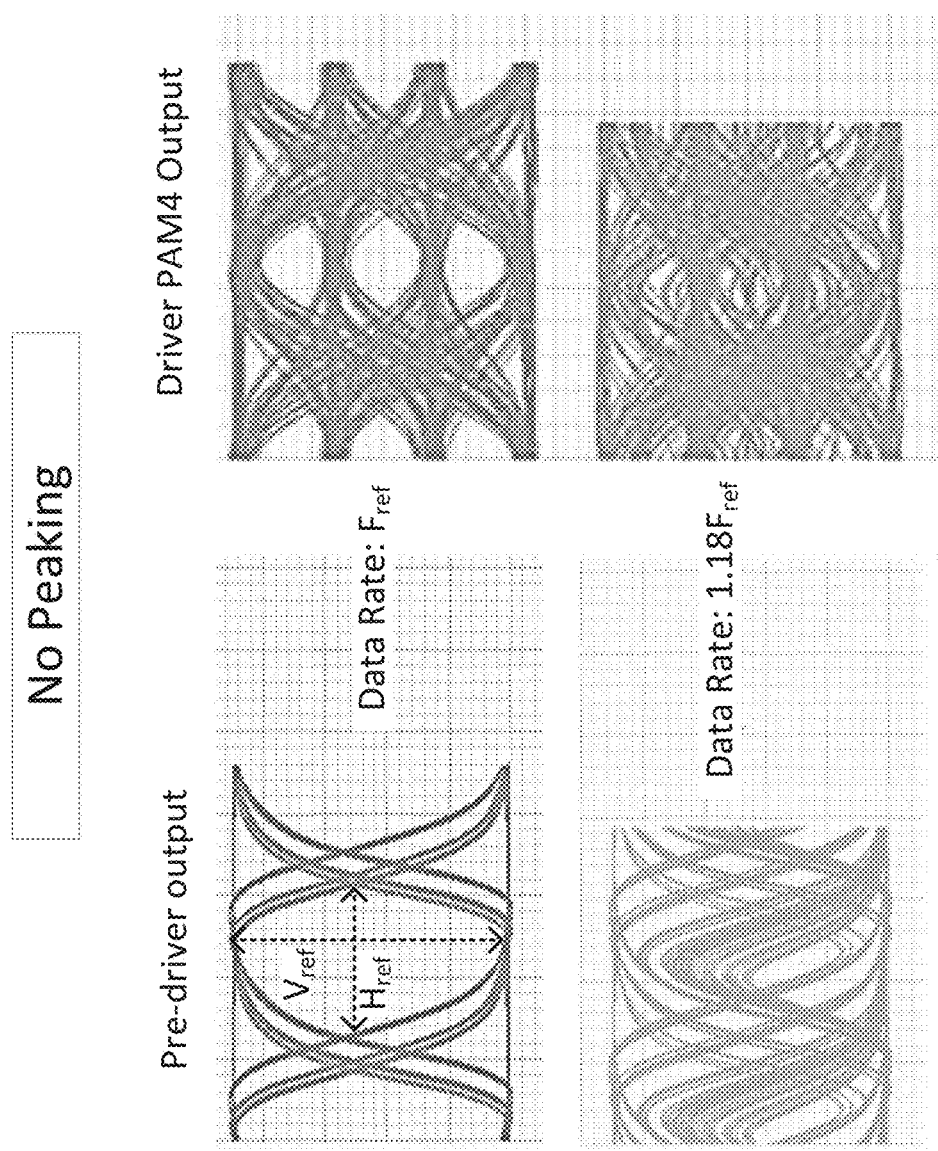
FIG. 1C shows output eye diagrams at the pre-driver output and downstream driver PAM4 output corresponding to the pre-driver of FIG. 1A and no-peaking.

With the highest fan-out on the first node A, it bears a lowest bandwidth (BW) for the signal transfer through the data path. The highest data rate that the pre-driver 120 can operate under the advanced 5 nm FinFET technology framework is limited to $F_{ref}$ Gbps (assuming that a sequence of four inverters is used in the CMOS inverter chain). Beyond this data rate $F_{ref}$, the output signal eye opening would suffer a loss, e.g., greater than 40%. FIG. 1B is a plot of eye opening versus data rate for node E in the pre-driver based on the CMOS inverter-chain of FIG. 1A. The eye opening refers to the clear space in the center of the eye diagram where the waveform does not venture. Eye width is the width of the eye opening at a specified amplitude (usually half amplitude) and is measured along the time axis. The eye width ratio $H_{ref}$ in reference to Tbit (bit time, which is the reciprocal of the bit rate) is a measure of the timing margin. Eye height is the vertical opening of the eye diagram and is measured along the voltage axis. The eye height ratio $V_{ref}$ in reference to VDD (the supply voltage) is the ratio of the eye height to the maximum swing of the voltage representing the logic levels. It indicates the voltage margin; a larger ratio means a greater margin for the signal to overcome voltage noise. As shown, for data rate at about $1.18 F_{ref}$, at the output node E of the pre-driver 120, the eye height ratio (in reference to VDD voltage supply) is less than 60% and the eye width ratio in reference to Tbit (bit time) is barely 40%. The eye diagrams shown in FIG. 1C for the output signal swings at the output of the pre-driver 120 is evidently showing that the eye openings at the data rate of $1.18 F_{ref}$ become almost smeared. The eye diagrams at the output of downstream driver PAM4 modulator (FIG. 1C) also shows a clear eye opening only for data rate at $F_{ref}$ (or lower) The eye diagram for data rate at $1.18 F_{ref}$ shows signal pulses shifting in different delay times due to high interferences, yielding smeared eyes. This indicates that the maximum operable data rate is limited to $F_{ref}$. The possible ways under this no-peaking architecture to improve the bandwidth of the pre-driver chain include using a large number of inverter stages, much larger than 4-stages of FIG. 1A, and minimizing fan-out. While increasing inverter stages causes an increase of random mismatch of impedances along the data path and higher noise accumulation, minimizing the fan-out would also be difficult to implement for small inverter sizes since each fan-out finger addition is a significant fraction of the total size.

Figure 2A:
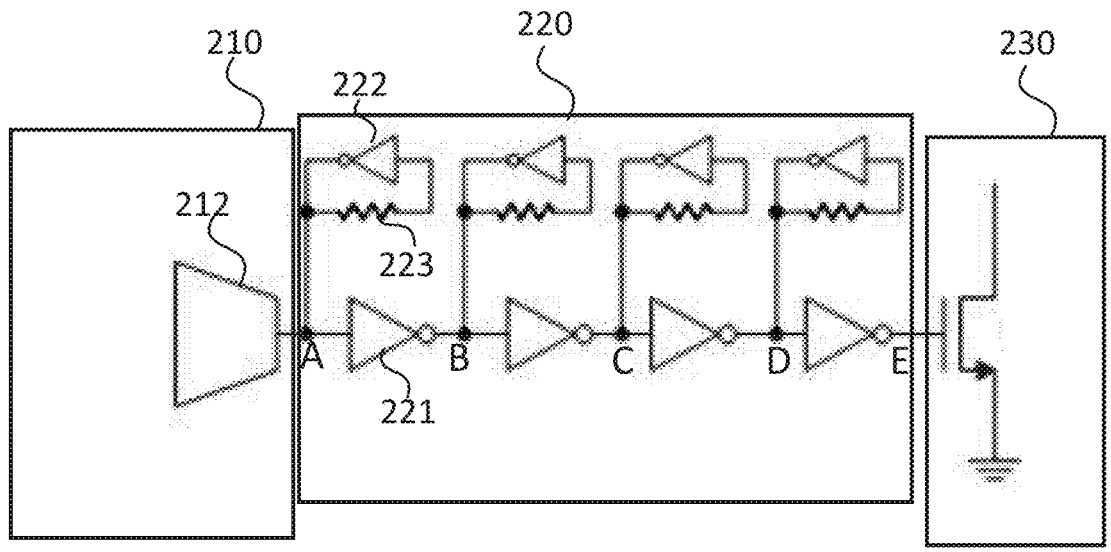
FIG. 2A is a schematic diagram of a pre-driver data path based on a CMOS inverter-chain with active peaking.

One proposal for improving the bandwidth of the CMOS inverter chain includes using active peaking. FIG. 2A is a schematic diagram of a pre-driver data path based on a CMOS inverter-chain with active peaking. The pre-driver 220 is coupled between the multiplexer 212 of the serializer 210, where the input signal is received from at a first node A of a data path, and a switch 230, where the signal is outputted from the last node E to a DAC driver for controlling digital-to-analog operation. The pre-driver 220 is still implemented as a sequence chain of CMOS inverters 221 coupled from the first node A, through a second node B, a third node C, a fourth node D to the last node E in the data path. As shown in FIG. 2A, the active peaking is implemented using an inverter 222 with feedback resistor 223 connected to pre-driver nodes from node A to D. The active peaking means to increase signal spectrum response at higher frequency range for effectively increasing the bandwidth. Specifically, the active peaking reduces the DC impedance at the output of inverter 222. The active peaking also increases the impedance at higher frequencies attributed to the gate parasitic capacitances of the inverter 222 that shunts the feedback resistor 223. This results in spectrum response peaking and bandwidth improvement. Optionally, the amount of peaking can be increased by increasing the size of the peaking inverter 222 and/or increasing the resistance of the feedback resistor 223. However, increasing the peaking inverter size reduces the DC gain, which needs to be recovered using more stages for the inverter chain 221.

Also, increasing the feedback resistance increases the R/F times at the peaking inverter input response. As a result, more stages with active peaking are needed, which increases the overall power consumption.

Figure 2B:
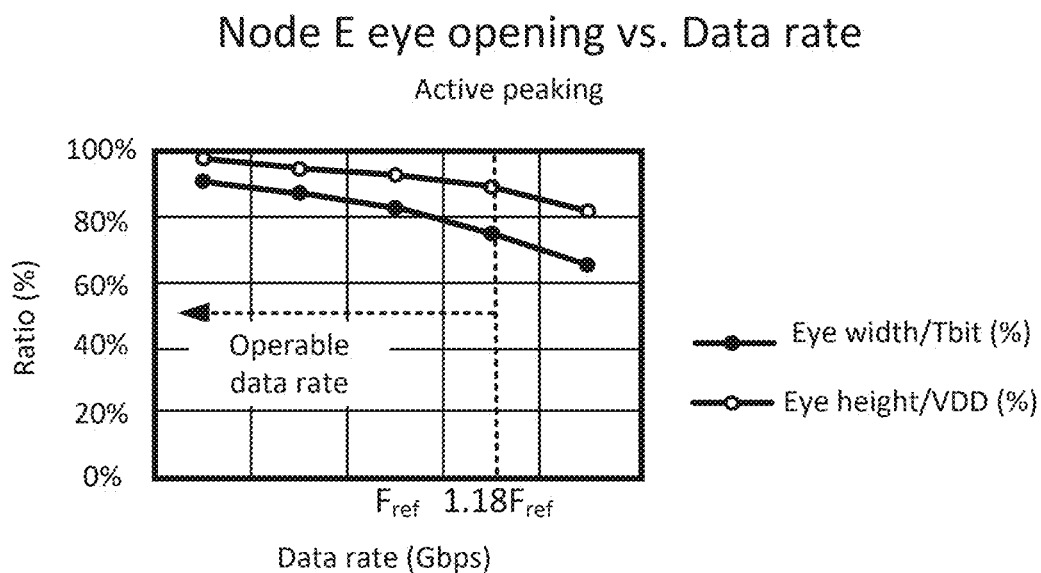
FIG. 2B is a plot of eye opening versus data rate for node E in the pre-driver with active peaking of FIG. 2A.
Figure 2C:
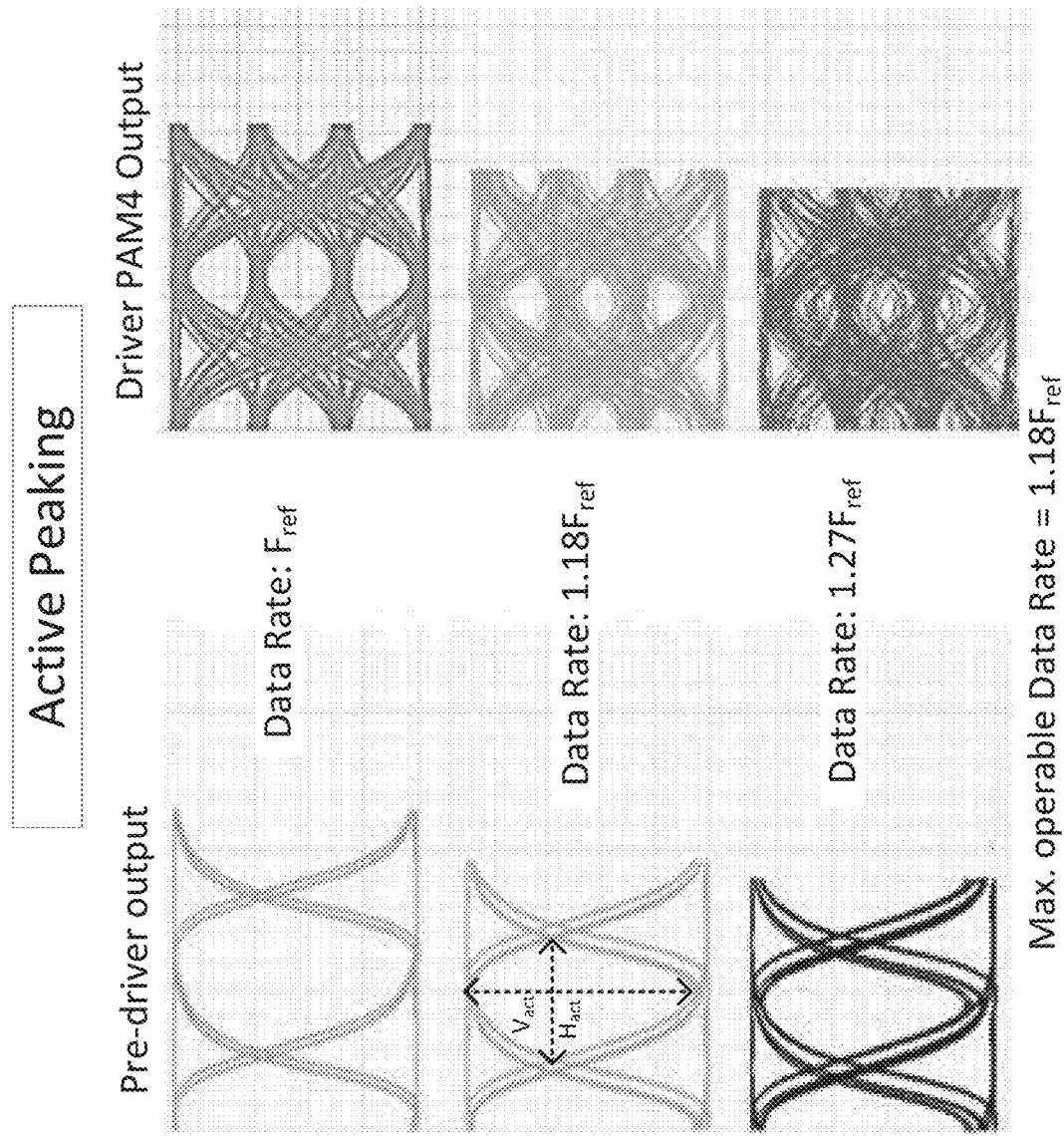
FIG. 2C shows output eye diagrams at the pre-driver output and downstream driver PAM4 output corresponding to the pre-driver of FIG. 2A with active peaking.

FIG. 2B is a plot of eye opening versus data rate for node E in the pre-driver 220 with active peaking of FIG. 2A. With active peaking (assuming four stages of the inverter chain as shown in FIG. 2A), the highest operable data rate is enhanced to $1.18 F_{ref}$. As shown in FIG. 2B, when the data rate is over $1.18 F_{ref}$, the eye width ratio $H_{act}$ at the output node E of the pre-driver 220 falls to about 65% and the eye height ratio $V_{act}$ in reference to VDD voltage supply falls to about 80%. The operable data rate with active peaking would be still limited to just $1.18 F_{ref}$ or lower. FIG. 2C shows eye diagrams at the output of the pre-driver 220 as well as at downstream DAC driver PAM4 output. As shown, the eye diagram at the output of the pre-driver with active peaking does improve the performance with higher data rate like $1.18 F_{ref}$. At higher rare $1.27 F_{ref}$ pulse shifting become more evident. The eye diagram at the DAC driver output shows visible clear eye openings for data rates up to $1.18 F_{ref}$ with an improved performance over non-peaking pre-driver. But as data rate is increased to $1.27 F_{ref}$, signal interference shifts become evident of poor transmission performance. Thus, the technique based on the pre-driver with active peaking (assuming that it is based on the four-stage inverter-chain) can only achieve a performance with maximum operable rate at $1.18 F_{ref}$.

One general aspect of the present disclosure includes a circuit for driving digital-to-analog converters. The circuit also includes a serializer configured to combine multiple signals into one input signal to drive a forward inverter, the forward inverter being coupled to a first node and characterized by a first impedance in a serial configuration and a first capacitance in a parallel configuration. The circuit also includes a chain of inverters coupled in series from the first node to a m-th node with each n-th inverter being followed after n-th node and configured to transfer the input signal to the last node based on a signal transfer function, where n is an integer variable from 1 to m. The circuit also includes a first feedback inverter coupled from at least a third node along the chain to the first node to form a first feedback loop, the first feedback loop including two inverters after the first node and being configured to increase bandwidth by adding peaking response of the signal transfer function at the first node and the third node. The circuit also includes a switch coupled to the m-th node.

Implementations may include one or more of the following features. The circuit where the chain of inverters may include four inverters sequentially with a first inverter, a second inverter, a third inverter, and a fourth inverter, the first inverter being coupled between the first node and a second node, the second inverter being coupled between the second node and the third node, the third inverter being coupled between the third node and a fourth node, the fourth inverter being coupled between the fourth node and a fifth node, where m=5. The first feedback loop is characterized by a first time-constant τ associated with the first inverter coupled to the second inverter in the chain of inverters included in the feedback loop, where τ increases its value by adding more inverters in the chain of inverters included in the feedback loop. The first feedback inverter is configured to provide a zero at $(1/\tau)$ in the signal transfer function at the first node. The first feedback inverter is configured to reduce the signal transfer function at the third node to a single-pole response by canceling one pole at $(1/\tau)$. The circuit may include a second feedback inverter coupled to the third node to form a second feedback loop driven from the fifth node along the chain with two inverters after the third node, the second feedback loop being characterized by a second time-constant and configured to add peaking amount in frequency response of the signal transfer functions at the third node and the fifth node. The first feedback inverter is characterized by a transconductance $g_m$, where impedance at the first node is a function of $1/g_m$. The first feedback inverter is configured to reduce DC gain of the impedance at the first node and increase peaking amount at high frequencies in the signal transfer function at the first node and the third node, hereby increasing bandwidth. The first feedback inverter may include a current-starved invertor may include a first PMOS transistor and a second PMOS transistor having a first common source terminal, a first NMOS transistor and a second NMOS transistor having a second common source terminal, the first PMOS transistor and a first NMOS transistor having a first common drain terminal configured to be a first differential output terminal, the second PMOS transistor and a second NMOS transistor having a second common drain terminal configured to be a second differential output terminal, the first PMOS transistor and the first NMOS transistor having a first common gate terminal configured to be a first differential input terminal, the second PMOS transistor and the second NMOS transistor having a second common gate terminal configured to be a second differential input terminal, the first common source terminal being coupled to a source voltage VDD via a third PMOS transistor with a first gate controlled by a first voltage and the second common source terminal being coupled to ground via a third NMOS transistor with a second gate controlled by a second voltage. The first voltage and the second voltage are varied based on an additive complementary to the source voltage VDD for tuning bias currents flown respectively from a source to the first common source terminal and from the second common source terminal to ground. The first voltage and the second voltage are independently varied for adjusting peaking amount in frequency response of the signal transfer function.

Another general aspect of the present disclosure includes a device with extended bandwidth for high-speed serial link. The device also includes an input inverter configured to receive an input signal from an output of a transmission stage, the input inverter having a first output impedance coupled in series to a first node and a first capacitance coupled in parallel to the first node. The device also includes a plurality of inverters coupled in a serial chain and configured to drive the input signal based on a signal transfer function from the first node to an output node. The device also includes a feedback inverter coupled between the first node and at least the third node in the serial chain after two inverters to form a feedback loop, the feedback loop being configured to increase bandwidth by adding peaking amount in frequency response of the signal transfer function.

Implementations may include one or more of the following features. The device where the plurality of inverters may include a first inverter, a second inverter, a third inverter, and a fourth inverter, the first inverter being coupled between the first node and a second node, the second inverter being coupled between the second node and the third node, the third inverter being coupled between the third node and a fourth node, the fourth inverter being coupled between the fourth node and the output node. The feedback loop is characterized by a time-constant τ that is configured to increase its value by adding more inverters in the serial chain that is included in the feedback loop. The feedback inverter is configured to provide a zero at (1/τ) in the signal transfer function at the first node and cancel a pole at (1/τ) in the signal transfer function at the third node. The first feedback inverter is characterized by a transconductance $g_m$ and is configured to reduce DC gain of impedance at the first node, where the impedance at the first node is a function of $1/g_m$, and to increase peaking amount at high frequencies in the signal transfer function at the first node and the third node, hereby increasing bandwidth. The feedback inverter may include a pair of PMOS transistors with a first common source terminal and a pair of NMOS transistors with a second common source terminal, a first one of the pair of PMOS transistors being coupled to a first one of the pair of NMOS transistors at a first common drain terminal configured as a first differential output coupled to the first node and having a first common gate terminal configured to receive a first differential input from the third node, a second one of the pair of PMOS transistors being coupled to a second one of the pair of NMOS transistors at a second common drain terminal configured as a second differential output coupled to the first node and having a second common gate terminal configured to receive a second differential input from the third node. The feedback inverter further may include a third PMOS transistor having a drain terminal coupled to the first common source terminal and a source terminal coupled to a source voltage and a third NMOS transistor having a drain terminal coupled to the second common source terminal and a source terminal coupled to ground, the third PMOS transistor having a gate terminal provided by a first control voltage, the third NMOS transistor having a gate terminal provided by a second control voltage. The third PMOS transistor and the third NMOS transistor degenerate drain-source voltages across one of the pair of PMOS transistors or one of the pair of NMOS transistors. The first control voltage and the second control voltage are adjustable with a limit that the first control voltage and the second control voltage are additive complementary to the source voltage VDD for tuning bias currents flown respectively from a source to the first common source terminal and from the second common source terminal to ground. The first control voltage and the second control voltage are independently tuned to program the bias currents to control peaking amount in frequency response of the signal transfer function added by the feedback inverter. The device may include a second feedback inverter coupled between the third node and the output node in the serial chain to form a second feedback loop to increase bandwidth by adding peaking amount in frequency response of the signal transfer function at the third node.

Figure 3A:
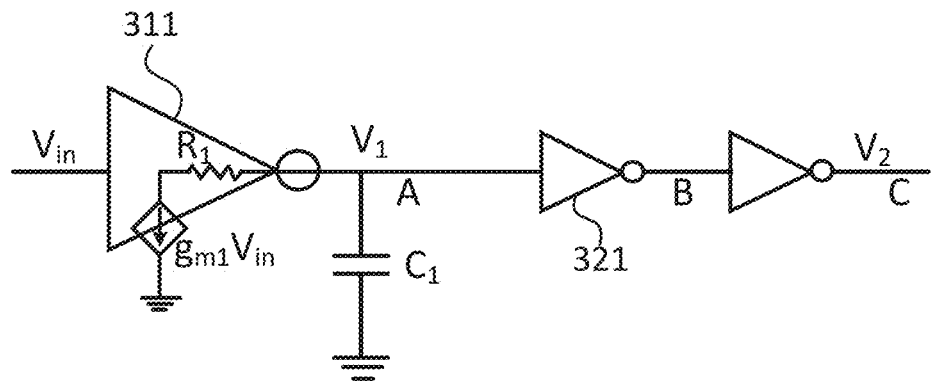
FIG. 3A is a simplified circuit diagram of a pre-driver without peaking.

FIG. 3A is a simplified circuit diagram of a pre-driver without peaking. In high-speed data communication systems, pre-driver is an intermediary stage that prepares the digital signal for the final driving stage, ensuring it is optimized for the modulator to encode the information correctly onto the transmission medium with minimal errors. For advanced modulator, e.g., PAM4 modulator, it requires precise control over the amplitude of the signal, as any distortion can lead to errors in interpreting the four distinct amplitude levels of signal encoding. In this diagram, an input signal to be processed by the pre-driver is one signal $V_{in}$ provided by a serializer by combining (usually using a multiplexer) multiple signals. The serializer is a component that converts parallel data into serial data. It is used when data needs to be transmitted over a medium that can only handle one bit at a time, such as over long distances or through certain types of communication interfaces. In a viewpoint of the pre-driver for receiving the signal $V_{in}$ as an input signal, inverter 311 is used to simulate an input-stage architecture that delivers the input signal $V_{in}$ to a first node A in a forward path. A node is generally referred as one of a connection point in the circuit. The inverter 311 is also called a forward inverter $M_1$ as it is placed in a forward path from an input port to an output port, to be distinguished from the inverter added in a feedback path from an output port (node) to an input port (node). The forward inverter 311 is coupled with the first node A with a first output impedance $R_1$ in a serial configuration in the forward path and a first capacitance $C_1$ in a parallel configuration between the first node A and ground. The forward inverter $M_1$ is characterized by a first transconductance $g_{m1}$ to deliver the input signal $V_{in}$ to a first output signal $V_1$ at the first node A via a signal transfer function. A signal transfer function is a mathematical representation that describes how an input signal is transformed into an output signal by a system or a stage of the system. The transfer function defines the relationship, depended on specific design of the associated data path architecture, between the output response and the input in the frequency domain. For example, the first output signal $V_1$ is the output signal of the input stage with the input signal $V_{in}$. Thus, the signal transfer function at the first node A can be given as:

$$\frac{V_1}{V_{in}} = -g_{m1} R_1 \left[ \frac{1}{1 + sR_1 C_1} \right], \quad (1)$$

where s is the Laplace variable in frequency domain.

Additionally, the first node A is also the input port of the pre-driver which is composed of a sequence of CMOS inverter chain where inverter 321 and inverter 322 are coupled in a serial configuration. Each inverter in the CMOS inverter chain, such as inverter 321, is coupled in series between two nodes, such as the first node A and the second node B, forming one stage of a buffer for the signal. The CMOS inverter chain is characterized by a transfer function of $H(s) = 1/(1+s\tau)$, where $\tau$ is a time-constant associated with the buffer (depending on number of stages in the chain). Thus, for any stage of the CMOS inverter chain 321, the signal transfer function can be obtained by the product of the function (1) and the buffer transfer function $H(s)$. For example, a second output signal at the third node C is $V_2$, then the signal transfer function at the third node C can be expressed by:

$$\frac{V_2}{V_{in}} = -g_{m1} R_1 \left[ \frac{1}{(1 + sR_1 C_1)(1 + s\tau)} \right]. \quad (2)$$

Note, the CMOS buffer provides an additional pole to the signal transfer function at $$s = -\frac{1}{\tau}.$$

Figure 3B:
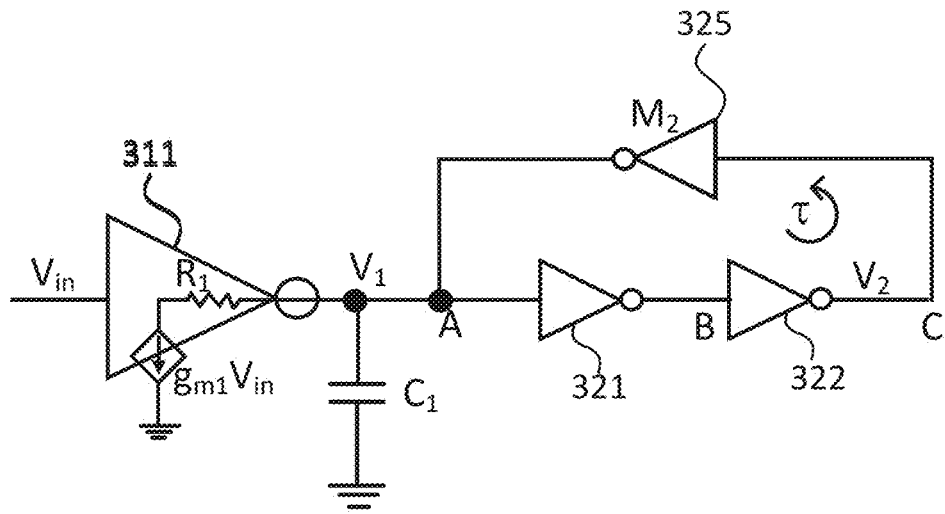
FIG. 3B is a simplified circuit diagram of a pre-driver with a feedback inverter providing DFE-based peaking according to an embodiment of the subject technology.

In an embodiment, to push the operation data rate further with greater bandwidth, a feedback inverter $M_2$ is added to couple with a bandwidth-limiting node of the CMOS inverter-chain. FIG. 3B is a simplified circuit diagram of a pre-driver with a feedback inverter providing peaking according to an embodiment of the subject technology. As shown, an inverter 325 is added between the third node C and the first node A to from a feedback loop. The inverter 325 is also called a feedback inverter $M_2$ in the feedback loop. The first node A is the bandwidth-limited node of the CMOS inverter-chain. The third node C is the node (output port) after two inverters, inverter 321 and inverter 322, from the first node A (the input port). The feedback inverter $M_2$ is characterized by a second transconductance $g_{m2}$. In an embodiment, $1/g_{m2}$ is selected with a much smaller value than the first output impedance $R_1$. The feedback inverter $M_2$ adds to the main (forward) inverter $M_1$ at the first node A. Since there are an odd number of inverters in the feedback loop, the inter-symbol interference in the data path is subtracted. In this example, with the addition of the feedback inverter 325, the impedance at the first node A is a function of both $g_{m1}$ and $g_{m2}$. In particular, the impedance at the first node A is a function of $1/g_{m2}$. By properly choosing the transconductance $g_{m2}$ of the feedback inverter $M_2$ the impedance at the first node A can be reduced, which produces a trade-off in gain and bandwidth by reducing the DC gain (defined as a product of the device transconductance and the device output impedance) while increasing the high frequency gain (e.g., the peaking amount) in the signal transfer function. Accordingly, the signal transfer function at the first node A can be expressed as:

$$\frac{V_1}{V_{in}} = -g_{m1} \left( \frac{1}{g_{m2}} \| R_1 \right) \left[ \frac{1 + s\tau}{1 + sC_1 \left( \frac{1}{g_{m2}} \| R_1 \right)} \right] \approx -\left( \frac{g_{m1}}{g_{m2}} \right) \left[ \frac{1 + s\tau}{1 + \frac{sC_1}{g_{m2}}} \right] \quad (3)$$

Based on function (3), the feedback loop with the feedback inverter $M_2$ 325 combined with two CMOS chain inverters 321 and 322 introduces a left-hand plane (LHP) zero to the transfer function at $$s = -\frac{1}{\tau},$$

i.e., negative one over the time-constant in frequency domain. In an embodiment, the feedback inverter 325 can reduce DC gain by a big ratio because R1 can be much greater $1/g_{m2}$. At the same time, the pole in frequency response of the transfer function (3) is pushed to a higher value comparing to the transfer function (1), represented by the change from $1/R_1 C_1$ to $g_{m2}/C_1$, as $R_1$ is much greater than $1/g_{m2}$. This effectively results in an increase of peaking frequency in the signal transfer functions at the first node and increase the pre-driver bandwidth at the first node A. The frequency-response-based bandwidth extension can be viewed as the feedback loop acting like a decision-feedback equalizer (DFE) to cancel inter-symbol interference (ISI) based on discrete times to provide resonant peaking to increase the bandwidth. Unlike traditional equalizers that try to reshape the channel before the decision device (e.g., DAC slice), the feedback loop is configured to feedback from previous symbol decisions to subtract out the expected ISI from the current symbol, thereby allowing for a more accurate decision on the current symbol. This bandwidth extension scheme is referred as DFE-based peaking that is relied on the feedback inverter which is added to the pre-driver and acted as a DFE to reshape the resonant peaking in the forward path. The DFE-based peaking in the transmitter can enhance or boost these high-frequency components to counteract expected ISI from the current symbol, effectively extending the working bandwidth. At the third node C, the signal transfer function can also be deduced and expressed as:

$$\frac{V_2}{V_{in}} \approx -\left(\frac{g_{m1}}{g_{m2}}\right)\left[\frac{1}{1 + \frac{sC_1}{g_{m2}}}\right] \quad (4)$$

Note, the feedback loop reduces the signal transfer function (4) at the third node C to a single-pole response by canceling the additional pole at $$s = -\frac{1}{\tau}$$

of the signal transfer function (2) without peaking at the third node C. The additional pole is canceled by the LHP zero once the DFE-based peaking is introduced via the feedback inverter $M_2$. The signal transfer function (4) at the third node C becomes a single-pole response function. The pole position is pushed to a higher value $g_{m2}/C_1 \gg 1/R_1C_1$ to realize an effect of adding peaking response in the frequency domain, indicating that the peaking at higher frequency compensates bandwidth loss in the chain of inverters. This results in an increase of peaking amount in the signal transfer functions at the third node C and effectively increasing the pre-driver bandwidth at the third node C.

Figure 4A:
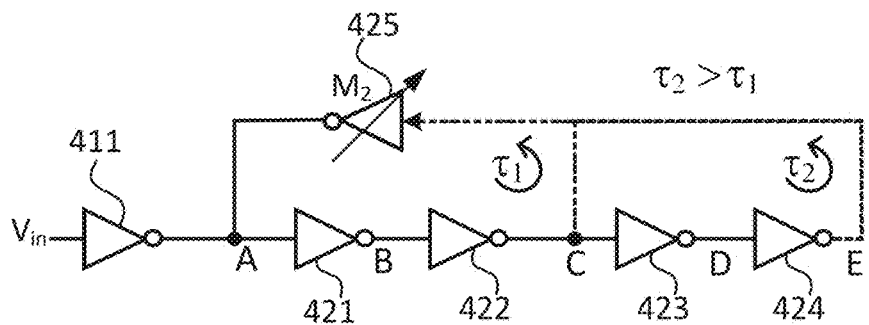
FIG. 4A is a simplified circuit diagram of a pre-driver with a feedback inverter having varied time-constants according to an embodiment of the subject technology.

FIG. 4A is a simplified circuit diagram of a pre-driver with a feedback inverter having varied time-constants according to an embodiment of the subject technology. In the feedback loop for providing the DFE-based peaking, according to the functions illustrated above, the peaking can be optimized in two ways. One way is to vary the feedback loop delay time-constant $\tau$. The time-constant $\tau$ can be varied by the number of inverters in the feedback loop. For example, in FIG. 3B, there are three inverters including the feedback inverter 325 and two inverters 321 and 322 in the main data path of the CMOS inverter chain. The time-constant associated with the feedback loop in FIG. 3B can be represented as $\tau_1$. In some embodiments, the number of the inverters in the feedback loop is kept as an odd number such that the inter-symbol interference can be subtracted and a DFE-based peaking bandwidth increase can be achieved. As shown in FIG. 4A, the feedback loop is expanded to 5 inverters by coupling the feedback inverter 425 between the first node A and the last node E, i.e., the driving node is shifted from two inverters, 421, 422, after the first node A by additional two inverters, 423, 424, in the CMOS inverter chain. Now, the time-constant of the feedback loop is represented as $\tau_2$, where $\tau_2 > \tau_1$. This can help in moving the LHP zero location in the frequency response and increasing the peaking amount.

Another way of tuning the DFE-based peaking is to vary the transconductance $g_{m2}$ of the feedback inverter 425. For the MOSFETs, the transconductance $g_m$ is proportional to channel width of the transistor and inversely proportional to the channel length of the transistor. In an inverter, which is composed of a complementary pair of transistors (NMOS and PMOS), the transconductance is determined by the on-state transistor in the pair. For example, when an inverter is transitioning and the NMOS is on (and PMOS is off), the transconductance of the inverter is roughly that of the NMOS transistor. The transconductance $g_{m2}$ of the feedback inverter 425 can be varied to optimize the gain-bandwidth product and trade-off lower DC gain for higher peaking.

Figure 4B:
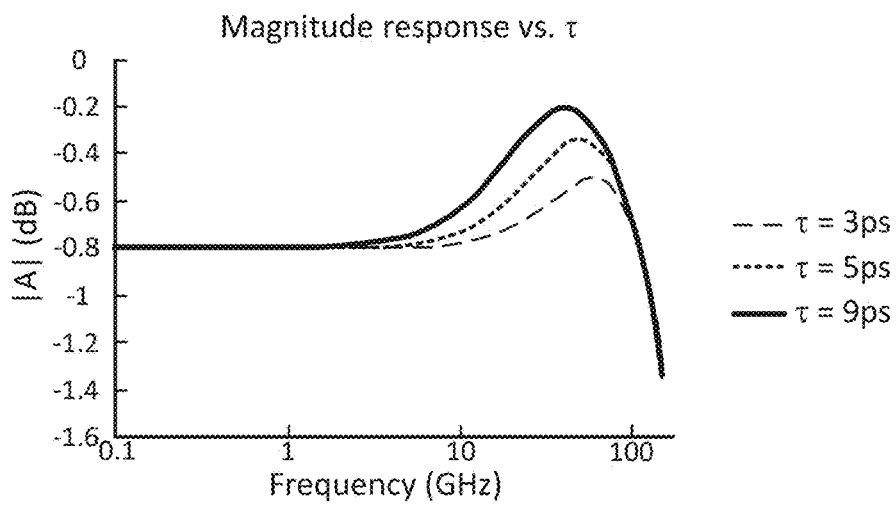
FIG. 4B is a plot showing effect of inverter-chain time-constant on peaking in frequency domain according to an embodiment of the subject technology.
Figure 4C:
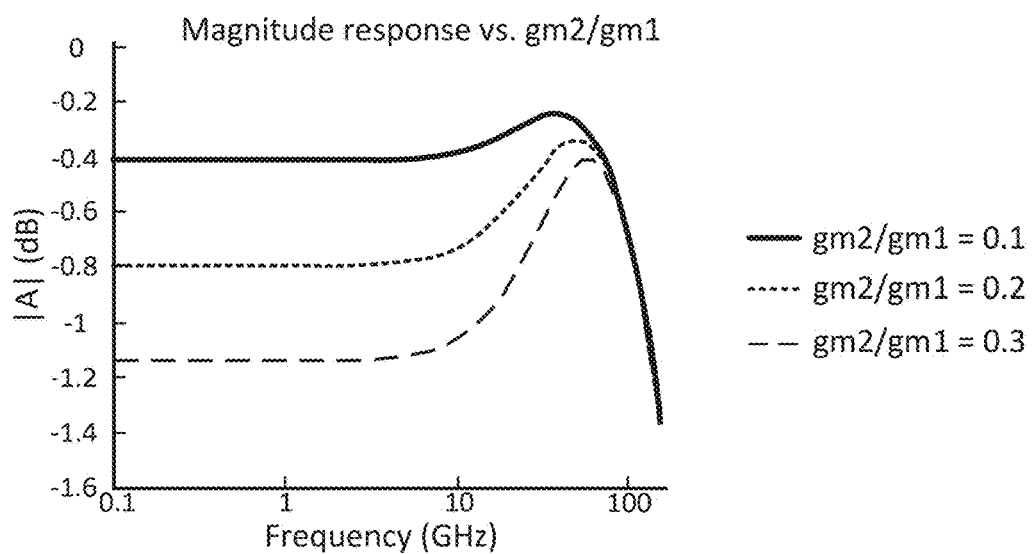
FIG. 4C is a plot showing the effect of feedback inverter transconductance on peaking in frequency domain according to an embodiment of the subject technology.

FIG. 4B is a plot showing effect of time-constant on peaking according to the embodiment of the subject technology. As shown, as the time-constant $\tau$ is adjusted from 3 ps to 5 ps and even higher 9 ps, the signal magnitude response in frequency domain is changed accordingly with its peak value shifted towards lower frequencies but peaking amount is increased. Peaking amount refers to the maximum increase or overshoot in the frequency response of the pre-driver beyond its steady-state or DC gain. It is a characteristic feature of transfer function exhibiting resonant behavior. Peaking frequency is a point where the gain of the pre-driver momentarily exceeds its normal level. It typically occurs at or near the system's resonant frequency. FIG. 4C is a plot showing effect of feedback inverter transconductance on peaking according to the embodiment of the subject technology. As shown, as the $g_{m2}$ is increased in reference to $g_{m1}$ (transconductance of the input inverter 411) from 0.1 to 0.3, the DC gain (represented by $$\frac{g_{m1}}{g_{m2}}$$

) will be lower, while the peaking magnitude response is increased, and also shifted towards higher frequencies.

Figure 5A:
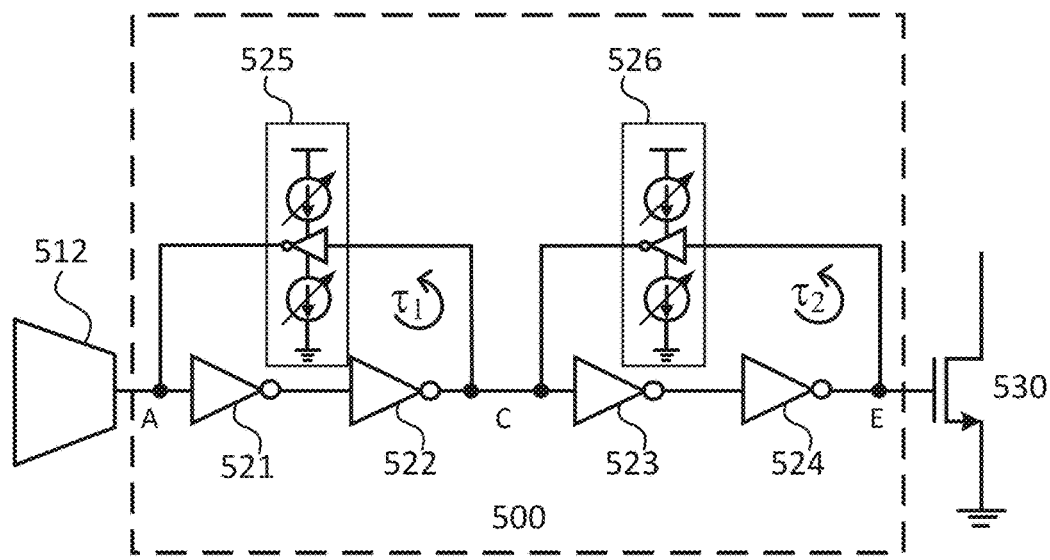
FIG. 5A is a simplified circuit diagram of a pre-driver with two feedback inverters according to an embodiment of the subject technology.

In an alternative embodiment, the pre-driver circuit described earlier can be modified with additional feedback loops after the first feedback loop (e.g., the feedback inverter 425 in FIG. 4A) formed along the data path of the CMOS inverter chain. FIG. 5A is a simplified circuit diagram of a pre-driver 500 with two feedback inverters 525 and 526 according to an embodiment of the subject technology. A pre-driver is an intermediate circuit or component that acts as a bridge between the primary signal source and final (DAC) driver stage and is configured to provide enhanced power transfer with impedance matching to ensure minimal signal reflection. In this present case, the pre-driver is intended to provide the desired signal transfer performance with enhanced working bandwidth. In an embodiment, the pre-driver circuit 500 of FIG. 5A includes a sequence of multiple inverters 521, 522, 523, and 524 coupled in series in a data path from a first node A to a fifth node E. The first node A is coupled to a multiplexer 512 associated with a serializer (e.g., a 4:1 serializer) to receive an input signal with high data rate. The fifth node E is configured to output a signal to an input stage of driver switch 530 for a digital-to-analog converter (DAC) driver. Optionally, the fifth node E is an output terminal of the pre-driver 500 configured to couple with any input stage of CMOS transmission data path.

The highest fan-out is at the interface between the multiplexer 512 and the pre-driver circuit 500, which is at the first node A configured as an input terminal of the pre-driver. In various implementations, the first node A of the pre-driver 500 can be coupled to an output of the multiplexer 512 as shown, or an output of an inverter, or any output stage of a CMOS-based transmission data path. Two feedback loop inverters 525 and 526 are added for providing DFE-based peaking in bandwidth extension. The first feedback inverter 525 is coupled to the first node A, to boost bandwidth at the node with the lowest bandwidth of the data path, and the third node C, which serves a driving node for the first feedback loop. In general, for a pre-driver with only one stage of feedback loop, the third node C becomes an output for the main path of the pre-driver, which can be coupled to any input switch or inverter or any input stage of CMOS-based transmission data path. The first feedback loop 525 is characterized by a first time-constant $\tau_1$ and a first feedback transconductance. The total number of the inverters in the first feedback loop is an odd number three, configured to ensure that the inter-symbol interference is subtracted. Optionally, the pre-driver 500 has four inverters in the chain with five nodes, the fifth node E now becomes the output for the main path, which can be coupled to the driver switch 530, or coupled to an inverter, or any input stage of CMOS-based transmission data path. A second feedback inverter 526 is coupled between the third node C and the fifth node E, adding a second peaking stage at the third node C. The second feedback loop is characterized by a second time-constant $\tau_2$ and a second feedback transconductance. The total number of the inverters in the second feedback loop is also an odd number, three, ensuring that the inter-symbol interference is subtracted.

Due to the increasing peaking amount compared to conventional active peaking (FIG. 2A), the bandwidth degradation at the second node B, the fourth node D, and the fifth node E are compensated. In FIG. 5A, the first feedback inverter 525 is introduced to form the first feedback loop between the first node A and the third node C. The first feedback loop mainly adds peaking to the first node A which is the bandwidth-limiting node in the inverter chain. In FIG. 5A, the second feedback inverter 526 is also introduced to form the second feedback loop between the third node C and the fifth node E, adding additional peaking to the third node C. As a result, only two nodes need to be peaked to achieve the peaking amount for the entire data path of the pre-driver, reducing the power overhead.

In some embodiments, the pre-driver proposed in FIG. 5A may include the CMOS inverter chain having even-number (>4) inverters e.g., 6 inverters, or 8 inverters in the chain from the first node to a last node. It may include just a first feedback inverter coupled between the first node and a driving node to form one feedback loop, where the driving node may be selected from the third node, the fifth node, and the last node. It may alternatively include 3 or more feedback inverters with each having two inverters in the chain. In some embodiments, these feedback inverters and associated circuitry layout designs can be determined by specific application as certain tradeoffs need to be considered in pursuing broader bandwidth performance versus saving in cost as well as power consumption.

Figure 5B:
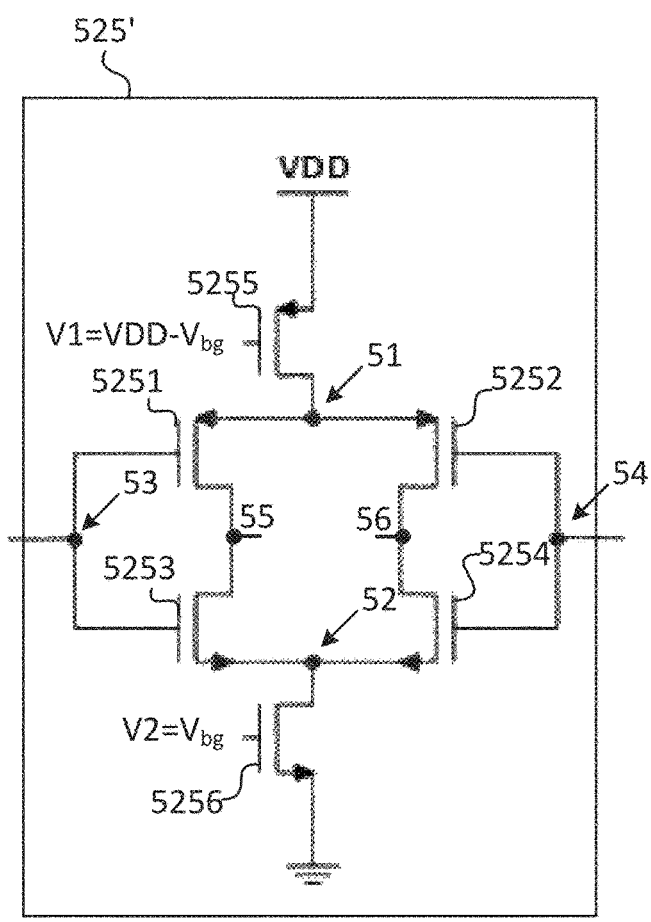
FIG. 5B is a simplified circuit diagram of the feedback inverter with programmable bias currents according to an embodiment of the subject technology.

FIG. 5B is a simplified circuit diagram of the feedback inverter with programmable bias currents according to the embodiment of the subject technology. In an embodiment, each of the added feedback inverters can be provided in a form of a current-starved inverter. Current-starved inverter is a variation of the standard CMOS inverter used in digital electronics, designed to allow for control over its switching characteristics. A standard CMOS inverter consists of a PMOS (p-type MOSFET) and an NMOS (n-type MOSFET) transistor. In a current-starved inverter, additional transistors (usually NMOS) are added in series with the pull-up (PMOS) and/or pull-down (NMOS) transistors of the inverter. Each feedback inverter 525 or 526 of FIG. 5A is configured to have its drive current being adjustable or programmable to control the peaking amount that the corresponding feedback inverter can add to the signal transfer function at the corresponding node. For CMOS implementation, the drive current can be controlled using additional transistors which effectively act like variable resistors such that their resistance (or conductance) can be dynamically adjusted by adjusting their gate voltages.

Figure 5C:
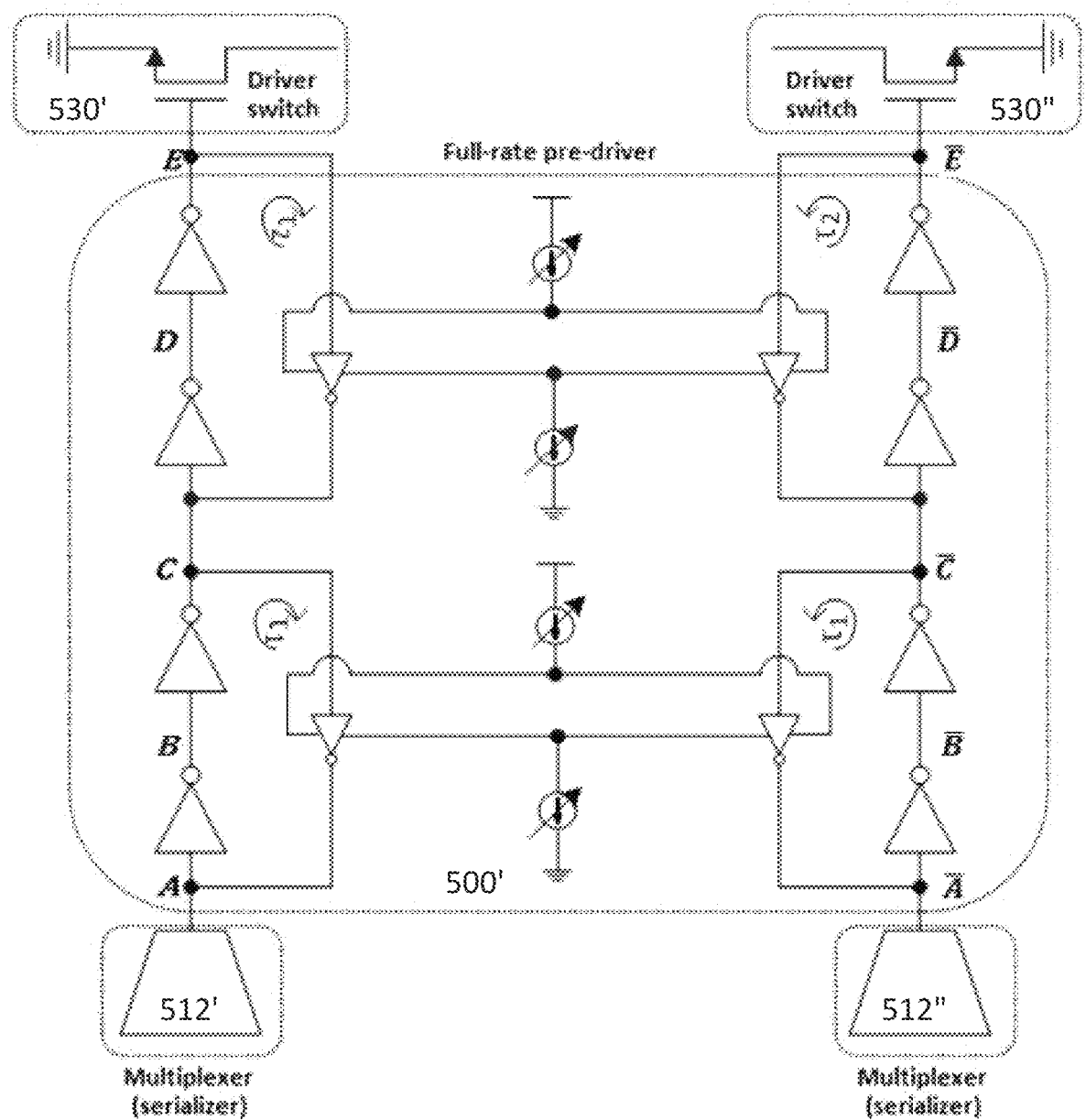
FIG. 5C is a simplified circuit diagram of a differential implementation of the pre-driver with two feedback inverters according to an embodiment of the subject technology

In an embodiment, the feedback inverters in the pre-driver of FIG. 5A can be implemented in a current-starved configuration with two current sources being added for degenerating the inverter to achieve reduction of voltage drops across the inverter transistors to alleviate hot-carrier injection (HCI) aging. FIG. 5B provides a simplified implementation of the current-starved architecture using a differential configuration to degenerate transistor transconductance and reduction on transistor gate-to-source voltage or drain-to-source voltage to decrease HCI aging. The gate-to-source voltage or drain-to-source voltage being lowered by the current-starved circuitry is more specifically illustrated in FIG. 5C. The pre-driver 500' includes two feedback inverters being configured in a differential implementation. As shown, the pre-driver 500' has two complementary (differential) main paths, each having four inverters in a serial chain. In one main path, the inverter chain has a first node A coupled to an output of a multiplexer 512' and a fifth node E coupled to input of a driver switch 530'. In a complementary main path, the inverter chain has a first node $\overline{A}$ coupled to an output of a multiplexer 512" and a fifth node $\overline{E}$ coupled to input of a driver switch 530". Specifically, the feedback inverters in the pre-driver 500' is a differential implementation for the current-starved feedback inverter 525 of FIG. 5A with common tails. The differential feedback inverter 525' includes a first PMOS transistor 5251 and a second PMOS transistor 5252 having a first common source terminal 51, a first NMOS transistor 5253 and a second NMOS transistor 5254 having a second common source terminal 52. The first/second PMOS transistor 5251/5252 has a common drain terminal 55/56 shared with the first/second NMOS transistor 5253/5254. The first common drain terminal 55 may be configured to be a first differential output coupled to the node A in the first main path of the pre-driver 500'. The second common drain terminal 56 may be configured to be a second differential output coupled to the node $\overline{A}$ in the second main path of the pre-driver 500'. The first PMOS/NMOS transistor 5251/5253 have a first common gate terminal 53 configured to receive a first differential input from the node C in the first main path of the pre-driver 500'. The second PMOS/NMOS transistor 5252/5254 have a second common gate terminal 54 configured to receive a second differential input from the node $\overline{C}$ in the second main path of the pre-driver 500'. Both differential input terminals are configured to receive a differential voltage signal to drive the first feedback inverter characterized by a time-constant $\tau_1$ for adding peaking amount via the signal transfer function to the differential output terminal 55/56 at nodes C and $\overline{C}$. The second feedback inverter with differential implementation is also added between nodes C and $\overline{C}$ and E and $\overline{E}$.

Referring to FIG. 5B, the current source in FIG. 5A is implemented. The first common source terminal 51 is coupled to a source voltage VDD via a third PMOS transistor 5255, a PMOS control transistor, with a first gate being applied by a first control voltage V1 for controlling a PMOS bias current of the first feedback inverter 525 from the source VDD to the first common source terminal 51. The second common source terminal 52 is coupled to ground via a third NMOS transistor 5256, an NMOS control transistor, with a second gate applied by a second control voltage V2 for controlling an NMOS bias current of the feedback inverter 525 from the second common source terminal 52 to the ground. In an embodiment, the first control voltage V1 and the second control voltage V2 are independently applied so that the PMOS bias current and the NMOS bias current can be independently adjusted for controlling the peaking amount in the signal transfer function. In an alternative embodiment, the first control voltage V1 is given by (VDD-$V_{bg}$) and the second control voltage V2 is given by $V_{bg}$. Here $V_{bg}$ is a reference voltage that can be dynamically adjustable. In this way, the first control voltage and the second control voltage are additive complementary to the source voltage VDD. Optionally, $V_{bg}$ is a bandgap voltage associated with the CMOS transistor. Optionally, $V_{bg}$ is greater than the threshold voltage of the NMOS transistor 5256. If $V_{bg}$ is close to the threshold voltage, the NMOS control transistor 5256 may allow only a small current to pass, effectively starving the inverter. If $V_{bg}$ is much larger than the threshold voltage, the NMOS control transistor 5256 may allow more current, providing more drive strength. When $V_{bg}$ is larger, it moves closer to VDD, turning the PMOS control transistor 5255 more conductive. Accordingly, the first control voltage V1 and the second control voltage V2 are programmable for bias current control of the feedback inverter 525 to control added peaking amount to the signal transfer function. For the first feedback inverter 525, the bias currents supplied to the respective source terminals can be tuned or programmed to adjust the peaking amount applied to the transfer function at first node A via the first feedback loop. For the second feedback inverter 526, similar current-starving circuitry designs as shown in FIG. 5B can be implemented with programmability on adjusting peaking amount in the transfer function at the third node C.

Figure 5D:
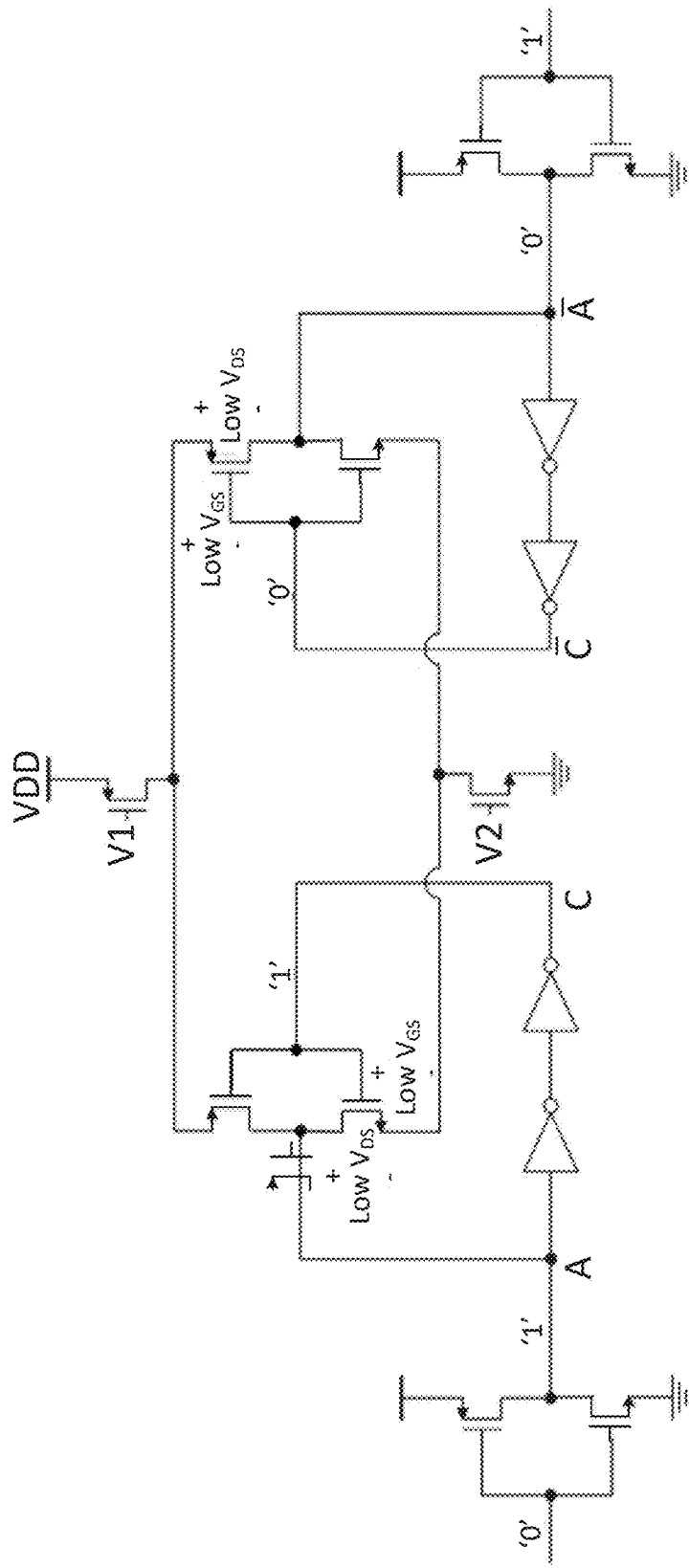
FIG. 5D is a simplified circuit diagram of a differential implementation of the feedback inverter with programmable bias control according to an embodiment of the subject technology.

The transistor self-heating is proportional to power dissipation $V_{DS}I_{DS}$. For the feedback inverter without using extra transistors for current-starved design, one of the transistors in the inverter experiences $V_{DS}=V_{GS}=$VDD. This increases the self-heating, causing an increase injunction temperature (proportional to the data duty cycle) and neighboring metals of the transistor. When both $V_{DS}$ and $V_{GS}$ are high or experience overlapping durations of high voltage, the HCI aging of the transistor becomes worse. For example, when input data bit is "1", the NMOS transistor in the feedback inverter has high HCI stress. When input data bit is "0", the PMOS transistor in the inverter has high HCI stress. The aging of the transistors may result in a gradual increase in the transistor threshold voltage $V_{th}$ with time and reduction in it's switch speed. In an embodiment, the high $V_{DS}/V_{GS}$ seen in single-ended inverter can be reduced by the current-starved circuitry design by degenerating the main inverter device with another transistor connected to each common source 51/52. Degeneration with added bias-control transistors for two common source terminals reduces the $V_{DS}/V_{GS}$ exposure of the main inverter transistor since it is split between two transistors. Additionally, differential implementation of the current-starved inverter architecture further provides advantages in reducing transistor aging by degenerating the drain-source voltage $V_{DS}$ and gate-source voltage $V_{GS}$. For example, the third PMOS transistor 5255 and the third NMOS transistor 5256 degenerate drain-source voltages $V_{GS}$ across one of the pair of PMOS transistors 5251/5252 or one of the pair of NMOS transistors 5253/5254. The drop in the transistor drain-source voltage during each duty-cycle operation of the current-starved feedback inverter directly help to reduce HCI stress and related transistor aging issue. FIG. 5D is a simplified circuit diagram of a differential implementation of the feedback inverter with programmable bias control according to an embodiment of the subject technology. The main path input A and $\overline{A}$ are configured to receive differential input from two complementary inverters. The output C and $\overline{C}$ are configured to provide differential inputs coupled into the feedback inverter. As shown, the feedback inverter degeneration by the added current sources via the differential architecture helps lowering the $V_{DS}/V_{GS}$ in respective transistors in two differential branches, further reducing transistor HCI aging. The common tail transistors with independent bias control (by V1 and V2) are used as a current source to fix the transconductance of the feedback inverter, hereby achieving programmable adjustment of peaking amount added to the input port A ($\overline{A}$) of the pre-driver.

Figure 6A:
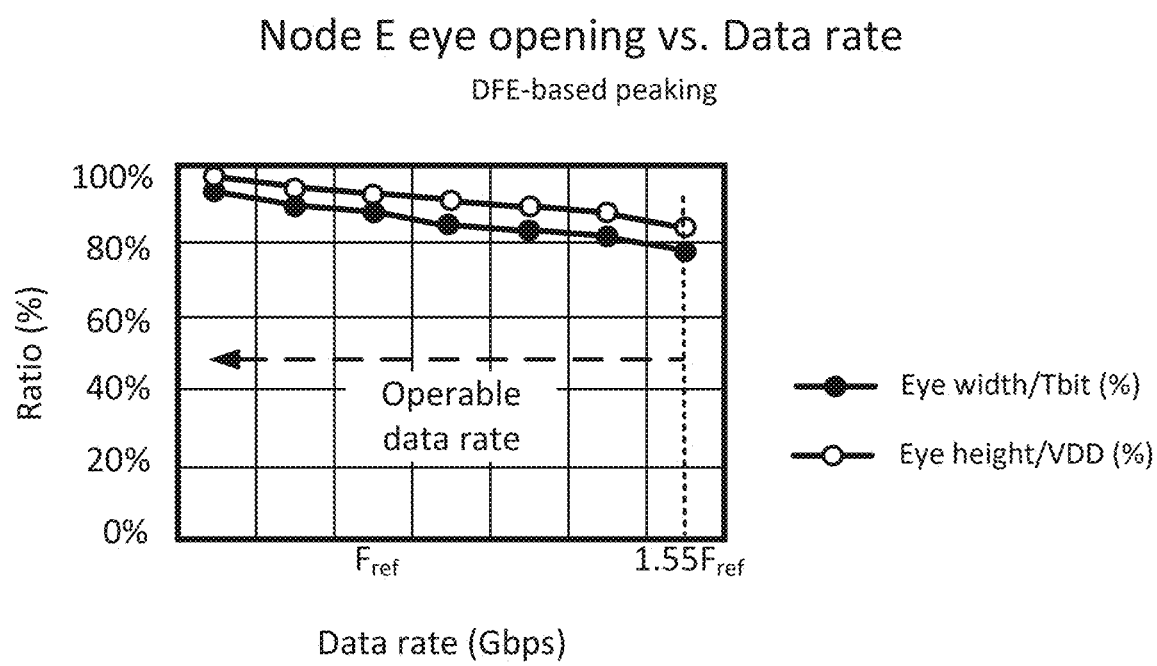
FIG. 6A is a plot of eye opening versus data rate for node E in the pre-driver with DFE-based peaking of FIG. 5A.

With DFE-based peaking being introduced using the pre-driver architecture of FIG. 5A, the highest operable data rate is improved. FIG. 6A is a plot of eye opening versus data rate for node E in the pre-driver with active peaking of FIG. 5A. As shown, the eye openings for signal outputs at the node E of the pre-driver circuit at different data rates are plotted. The eye width $H_{dfe}$ to Tbit ratio is near 80% even when the data rate is raised to 1.55 $F_{ref}$, here $F_{ref}$ refers to a reference of a typical maximum operable data rate for a conventional pre-driver. The eye height $V_{dfe}$ to VDD ratio also remains above 80% at 1.55 $F_{ref}$. These performance data of the DFE-based peaking technique demonstrate about 31% or higher improvement at least in some of the embodiments captured within the scope of this application over conventional active peaking technique. The residue phase peaking at the pre-driver output, i.e., node E, also can compensate for DAC driver bandwidth limitations and help to reduce inter-symbol interference at PAM4 modulator output that is coupled downstream after the switch 530. By reducing the number of nodes in the inverter-chain of the pre-driver from 4 to 2 being connected to the feedback inverters comparing to every node being coupled to one separate feedback segment for active peaking, the pre-driver power consumption can be reduced, e.g., by about at least 20%.

Figure 6B:
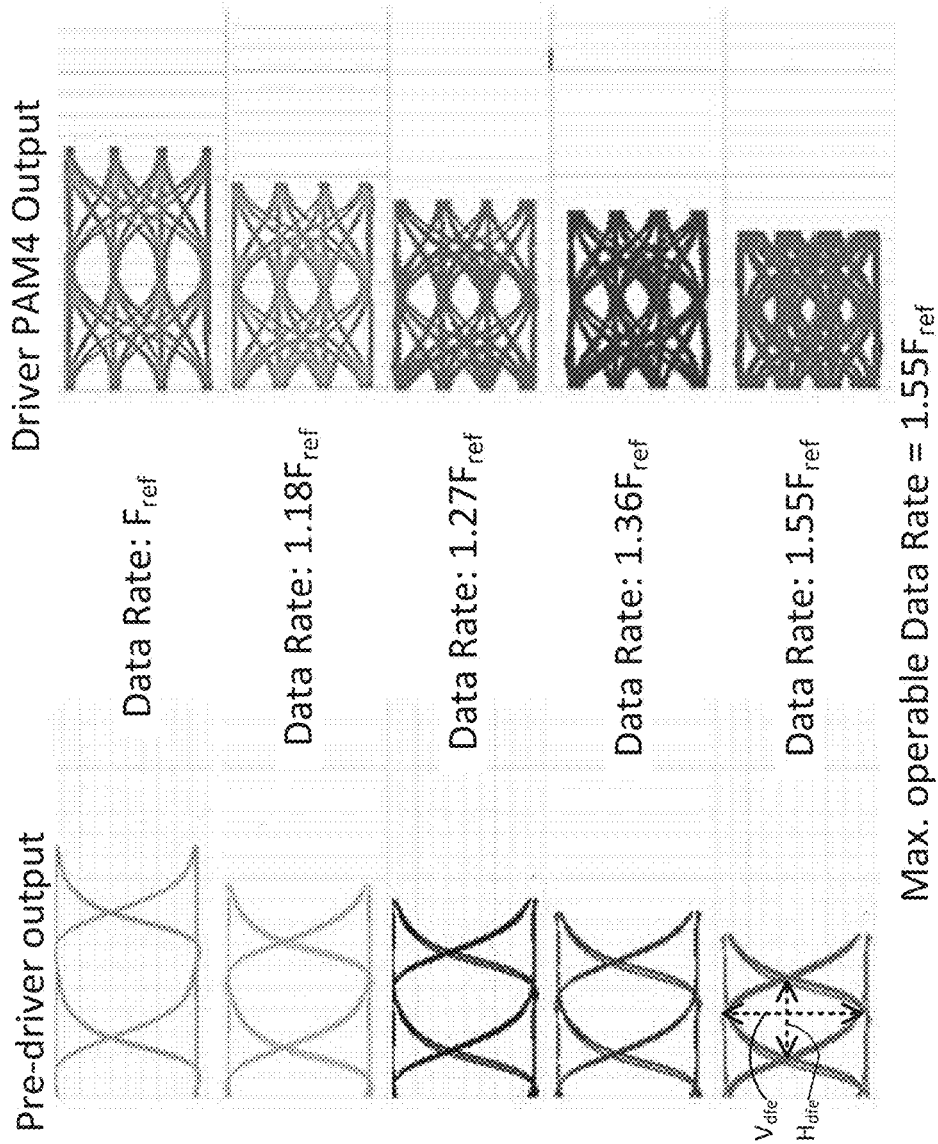
FIG. 6B shows eye diagrams at the pre-driver output and downstream driver PAM4 output corresponding to the pre-driver of FIG. 5A with DFE-based peaking.

FIG. 6B also shows eye diagrams at the output of the pre-driver with DFE-based peaking as well as at the downstream output of driver PAM4. As the data rate increases from $F_{ref}$ to 1.18 $F_{ref}$, 1.27 $F_{ref}$, 1.36 $F_{ref}$, and 1.55 $F_{ref}$, the eye diagrams demonstrate that the signal transmission performance is substantially improved with clear eye opening for all data rates above. The highest operable data rate for the pre-driver with DFE-based peaking is at least 1.55 $F_{ref}$ or higher. The performance is also significantly better than the pre-driver with active-peaking, which has its operable data rate limited at only 1.18 $F_{ref}$. With the increasing demand for high data rate, the electrical interface standards use PAM4 modulation to achieve higher spectral efficiency. The DFE-based pre-driver peaking disclosed in this application demonstrates that the operable data rate can be enhanced to 1.55 $F_{ref}$. In addition, even at lower data rate cases, e.g., at $F_{ref}$, the eye diagram is much clear with less lateral shift. That suggests the performance with the pre-driver based on DFE-peaking also enhance performance at lower data rate operation. In general, the proposed DFE-based pre-driver peaking can be implemented at an output of any high-speed serial link transmission lines and at an input for high-speed modulators. This implementation reduces the power consumption for all high-speed serial link transmitters operating at a data rate greater than 100 Gbps or clock rate greater than 50 GHz. The specific circuit implementations (for example, FIG. 5A and FIG. 5B) may be applied to high-order PAM-N modulation scheme where N>4 accordingly.

While the above is a full description of the specific embodiments, various modifications, alternative constructions and equivalents may be used. Therefore, the above description and illustrations should not be taken as limiting the scope of the subject technology, which is defined (for some embodiments) by the appended claims.

What is claimed is:

1. A circuit comprising:
   a serializer configured to combine multiple signals into a differential input signal having a first input signal and a complementary second input signal to drive a differential forward inverter, the differential forward inverter comprising a first forward inverter and a second forward inverter respectively coupled to a first node and to a first complementary node and each characterized by a first impedance in a serial configuration and a first capacitance in a parallel configuration;

a differential chain of inverters comprising a first chain of inverters coupled in series from the first node to a first fifth node and a second chain of inverters coupled in series from the first complementary node to a second fifth node, each n-th inverter in each chain being followed by a corresponding n-th node and configured to transfer the corresponding one of the differential input signals to the corresponding fifth node based on a signal transfer function, where n is an integer from 1 to 5;

a first differential feedback inverter coupled from a third node along the first chain to the first node and from a third complementary node along the second chain to the first complementary node to form a first differential feedback loop, the first differential feedback loop including two inverters after the first node in each chain and being configured to increase bandwidth by adding peaking response of the signal transfer function at the first and third nodes and at the first complementary and third complementary nodes, the first differential feedback inverter comprising:

a first PMOS transistor and a second PMOS transistor having a first common source terminal, a first NMOS transistor and a second NMOS transistor having a second common source terminal, the first PMOS transistor and the first NMOS transistor having a first common drain terminal configured to be a first differential output terminal coupled to the first node, the second PMOS transistor and the second NMOS transistor having a second common drain terminal configured to be a second differential output terminal coupled to the first complementary node, the first common source terminal being coupled to a source voltage VDD through a third PMOS transistor having a gate receiving a first control voltage V1, and the second common source terminal being coupled to ground through a third NMOS transistor having a gate receiving a second control voltage V2, wherein the first control voltage V1 and the second control voltage V2 are independently adjustable and additive-complementary relative to the source voltage VDD to program respective PMOS and NMOS bias currents for tuning an amount of the peaking response and for reducing drain-to-source and gate-to-source voltage stress across the first and second PMOS transistors and the first and second NMOS transistors to mitigate hot-carrier-injection aging;

a second differential feedback inverter coupled between the third node and the first fifth node and between the third complementary node and the second fifth node to form a second differential feedback loop having two inverters after the third node in each chain and configured to further increase bandwidth by adding peaking response of the signal transfer function at the third and fifth nodes and at the third complementary and fifth complementary nodes, the second differential feedback inverter including a current-starved differential structure identical to the first differential feedback inverter and programmable by the first and second control voltages; and a differential switch stage comprising a first switch coupled to the first fifth node and a second switch coupled to the second fifth node.

2. The circuit of claim 1, wherein the first differential feedback inverter is configured to reduce DC gain of impedance at the first node and the first complementary node and increase peaking amount at high frequencies in the signal transfer function at the first node, the first complementary node, the third node, and the third complementary node.

3. The circuit of claim 1, wherein the first PMOS transistor and the first NMOS transistor have a first common gate terminal configured to receive a first differential input from the third node, and the second PMOS transistor and the second NMOS transistor have a second common gate terminal configured to receive a second differential input from the third complementary node.

4. The circuit of claim 1, wherein the first control voltage V1 and the second control voltage V2 may be varied to adjust the PMOS and NMOS bias currents respectively, thereby allowing tuning of the peaking response in the signal transfer function.

5. The circuit of claim 1, wherein the third PMOS transistor and the third NMOS transistor may degenerate drain-source voltages across the first and second PMOS transistors and the first and second NMOS transistors respectively, which may reduce voltage stress and mitigate hot-carrier injection effects.

6. The circuit of claim 1, wherein the first control voltage V1 and the second control voltage V2 are varied based on an additive complementary relationship to the source voltage VDD for tuning bias currents flowing respectively from the source voltage VDD to the first common source terminal and from the second common source terminal to ground.

7. The circuit of claim 1, wherein the first control voltage V1 and the second control voltage V2 are independently varied for adjusting the peaking amount in the frequency response of the signal transfer function.

8. The circuit of claim 1, wherein the second differential feedback loop is characterized by a second time-constant and is configured to add peaking amount in the frequency response of the signal transfer functions at the third node, the third complementary node, the first fifth node, and the second fifth node.

9. A circuit comprising:

a differential input stage configured to receive a differential input signal;

a differential chain of inverters coupled to the differential input stage, the differential chain comprising a first inverter chain and a second inverter chain, each inverter chain including a plurality of series-connected inverters;

a first differential feedback inverter coupled between a first node pair and a second node pair of the differential chain of inverters to form a first differential feedback loop, the first differential feedback inverter comprising:

a first pair of PMOS transistors having a first common source terminal, a first pair of NMOS transistors having a second common source terminal, wherein the first pair of PMOS transistors and the first pair of NMOS transistors are cross-coupled to form differential output terminals;

a second differential feedback inverter coupled between the second node pair and a third node pair of the differential chain of inverters to form a second differential feedback loop;

a bias control circuit coupled to the first and second differential feedback inverters, the bias control circuit comprising:

a first bias transistor coupled between a supply voltage and the first common source terminal, the first bias transistor having a gate terminal receiving a first control voltage, a second bias transistor coupled between the second common source terminal and ground, the second bias transistor having a gate terminal receiving a second control voltage, wherein the first and second control voltages are independently adjustable to tune bias currents and peaking response of the first and second differential feedback inverters; and a differential output stage coupled to output nodes of the differential chain of inverters.

10. The circuit of claim 9, wherein the first pair of PMOS transistors and the first pair of NMOS transistors have respective common gate terminals configured to receive differential inputs from the second node pair.

11. The circuit of claim 9, wherein the first and second control voltages may be varied to independently adjust PMOS and NMOS bias currents of the first and second differential feedback inverters, thereby allowing tuning of peaking response in a signal transfer function of the circuit.

12. The circuit of claim 9, wherein the first bias transistor and the second bias transistor may degenerate drain-source voltages across the first pair of PMOS transistors and the first pair of NMOS transistors respectively, which may reduce voltage stress and mitigate hot-carrier injection effects.

13. The circuit of claim 9, wherein the first control voltage and the second control voltage may be varied based on an additive complementary relationship to the supply voltage for tuning bias currents flowing respectively from the supply voltage to the first common source terminal and from the second common source terminal to ground.

14. The circuit of claim 9, wherein the second differential feedback inverter comprises a current-starved differential structure substantially identical to the first differential feedback inverter and programmable by the first and second control voltages.

15. The circuit of claim 9, wherein the first and second differential feedback loops are characterized by respective time constants and are configured to add peaking amount in frequency response of signal transfer functions at their respective node pairs in the differential chain of inverters.

* * * * *